(12) United States Patent
Cheng

(10) Patent No.: US 10,490,718 B2
(45) Date of Patent: Nov. 26, 2019

(54) LIGHT EMITTING DIODE PACKAGE

(71) Applicant: ADVANCED OPTOELECTRONIC TECHNOLOGY, INC., Hsinchu Hsien (TW)

(72) Inventor: Chin-Fu Cheng, Hsinchu (TW)

(73) Assignee: ADVANCED OPTOELECTRONIC TECHNOLOGY INC., Hsinchu Hsien (TW)

( * ) Notice: Subject to any disclaimer, the term of this patent is extended or adjusted under 35 U.S.C. 154(b) by 0 days.

(21) Appl. No.: 16/009,378

(22) Filed: Jun. 15, 2018

(65) Prior Publication Data
US 2019/0326489 A1 Oct. 24, 2019

(30) Foreign Application Priority Data

Apr. 19, 2018 (CN) .......................... 2018 1 0359400

(51) Int. Cl.
H01L 33/50 (2010.01)
H01L 33/60 (2010.01)
H01L 33/36 (2010.01)
H01L 33/32 (2010.01)
H01L 33/52 (2010.01)
H01L 33/00 (2010.01)
H01L 33/30 (2010.01)

(52) U.S. Cl.
CPC .......... *H01L 33/60* (2013.01); *H01L 33/0079* (2013.01); *H01L 33/30* (2013.01); *H01L 33/32* (2013.01); *H01L 33/36* (2013.01); *H01L 33/505* (2013.01); *H01L 33/52* (2013.01); H01L 2933/005 (2013.01); H01L 2933/0041 (2013.01); H01L 2933/0058 (2013.01)

(58) Field of Classification Search
CPC ................................. H01L 33/60; H01L 33/50
See application file for complete search history.

(56) References Cited

U.S. PATENT DOCUMENTS

2015/0050760 A1* 2/2015 Imazu ..................... H01L 33/50
                                                          438/27
2018/0158998 A1* 6/2018 Imai ........................ H01L 33/48

FOREIGN PATENT DOCUMENTS

CN    105006508 A    10/2015
CN    205248303 U    5/2016
TW    201633564      9/2016
TW    201701510 A    1/2017

* cited by examiner

Primary Examiner — Thomas L Dickey
(74) Attorney, Agent, or Firm — ScienBiziP, P.C.

(57) ABSTRACT

A light emitting diode package includes a light emitting diode chip, a light conversion layer covering the light emitting diode chip, a reflecting layer surrounding the light emitting diode chip. The light emitting chip has a light output top surface, a first electrode and a second electrode. The first electrode and the second electrode are opposite to the light output top surface. The light emitting diode package further includes a supporting layer made of metal material. The supporting layer is mounted on a bottom surface of the reflecting layer facing away from the light output top surface and surrounds the light emitting chip and the light conversion layer.

10 Claims, 10 Drawing Sheets

LIGHT EMITTING DIODE PACKAGE

FIELD

The subject matter herein generally relates to a light emitting diode package and a method for manufacturing the light emitting diode package.

BACKGROUND

Light emitting diode package is a semiconductor device for converting current to light. The light emitting diode package is widely used in lighting, because the light emitting diode package has advantages of high brightness, low voltage, long life, environmentally friendly etc. The light emitting diode package needs to be thinner, but that cause to be more vulnerable.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
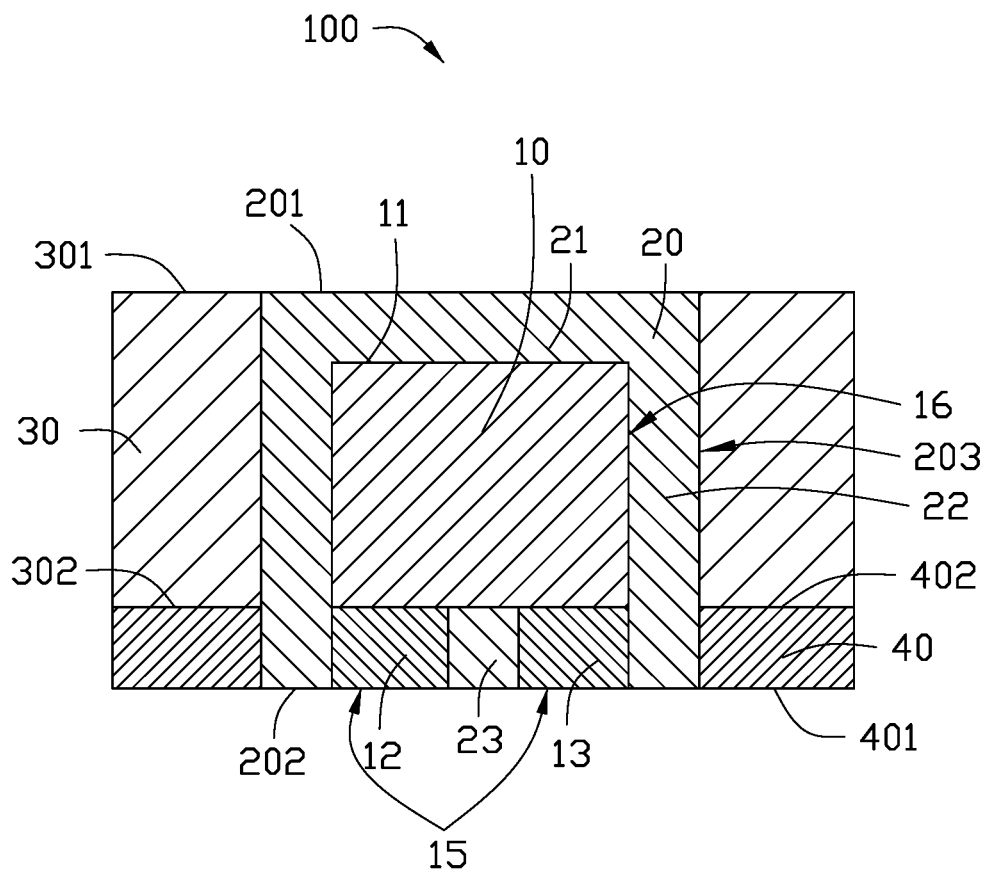
FIG. 1 is a cross-sectional view of an embodiment of a light emitting diode package.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
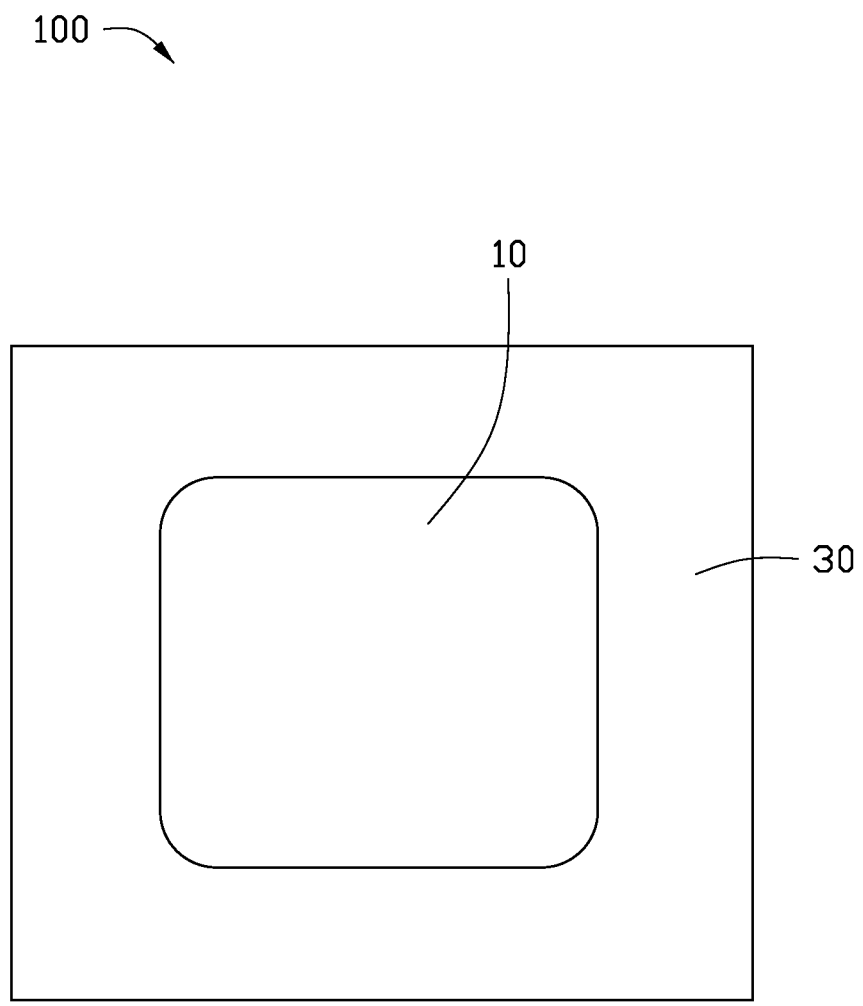
FIG. 2 is a vertical view of the light emitting diode package of FIG. 1.

FIGS. 1 and 2 illustrate an embodiment of a light emitting diode package 100. The light emitting diode package 100 comprises a light emitting diode chip 10, a light conversion layer 20, a reflecting layer 30, and a supporting layer 40.

The light emitting diode chip 10 comprises a light output top surface 11, a first electrode 12, and a second electrode 13. The first electrode 12 and the second electrode 13 face away from the light output top surface 11. In at least one embodiment, the light emitting diode chip 10 is made of a semiconducting material, such as gallium nitride or gallium arsenide.

The first electrode 12 and the second electrode 13 have a first bottom surface 15 facing away from the light output top surface 11. The light emitting diode chip 10 further comprises a first side wall 16 connecting the light output top surface 11 and the first bottom surface 15.

The light conversion layer 20 covers the light emitting diode chip 10, and the first bottom surface 15 is exposed.

In at least one embodiment, the light conversion layer 20 comprises a main portion 21 attached to the light output top surface 11, an extending portion 22 attached to the first side wall 16, and a filling portion 23 formed between the first electrode 12 and the second electrode 13. The light conversion layer 20 further comprises a first top surface 201, a second bottom surface 202 facing away from the first top surface 201, and a second side wall 203 connecting the first top surface 201 and the second bottom surface 202. The first top surface 201 is adjacent to the light output top surface 11, and the second bottom surface 202 is flush with the first bottom surface 15. The light conversion layer 20 converts a wavelength of an emitting light output from the light emitting diode chip 10. In at least one embodiment, the light conversion layer 20 is made of a light transmitting material comprising fluorescent powders or quantum dots.

The reflecting layer 30 surrounds and is attached to the second side wall 203 of the light conversion layer 20. The reflecting layer 30 comprises a second top surface 301 and a third bottom surface 302 facing away from the second top surface 301. The second top surface 301 is flush with the first top surface 201. In at least one embodiment, the reflecting layer 30 is made of an opaque resin material comprising titanium dioxide or silicon dioxide. The reflecting layer 30 has a thickness of about 150 µm to about 300 µm.

Figure 3:
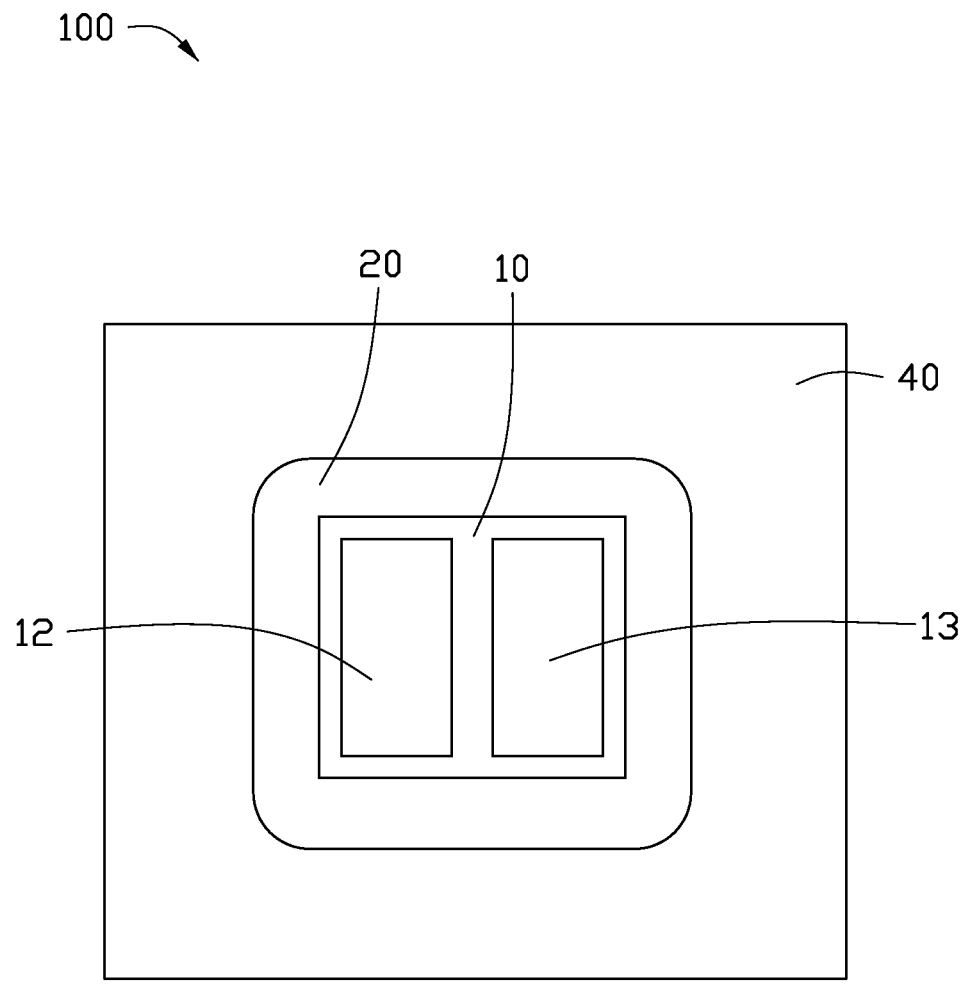
FIG. 3 is an upward view of the light emitting diode package of FIG. 1.

Referring to FIG. 3, the supporting layer 40 is formed on the third bottom surface 302, thereby improving mechanical strength of the light emitting diode package 100. The supporting layer 40 comprises a fourth bottom surface 401 and a third top surface 402 facing away from the fourth bottom surface 401. The third top surface 402 is attached to the third bottom surface 302. The fourth bottom surface 401 is flush with the second bottom surface 202. In at least one embodiment, the supporting layer 40 is made of a metal material, so heat generated by the light emitting diode chip 10 can be dissipated efficiently. The metal material may be selected from at least one of copper, nickel, and silver. The supporting layer 40 has a thickness of about 50 μm to about 150 μm.

Figure 4:
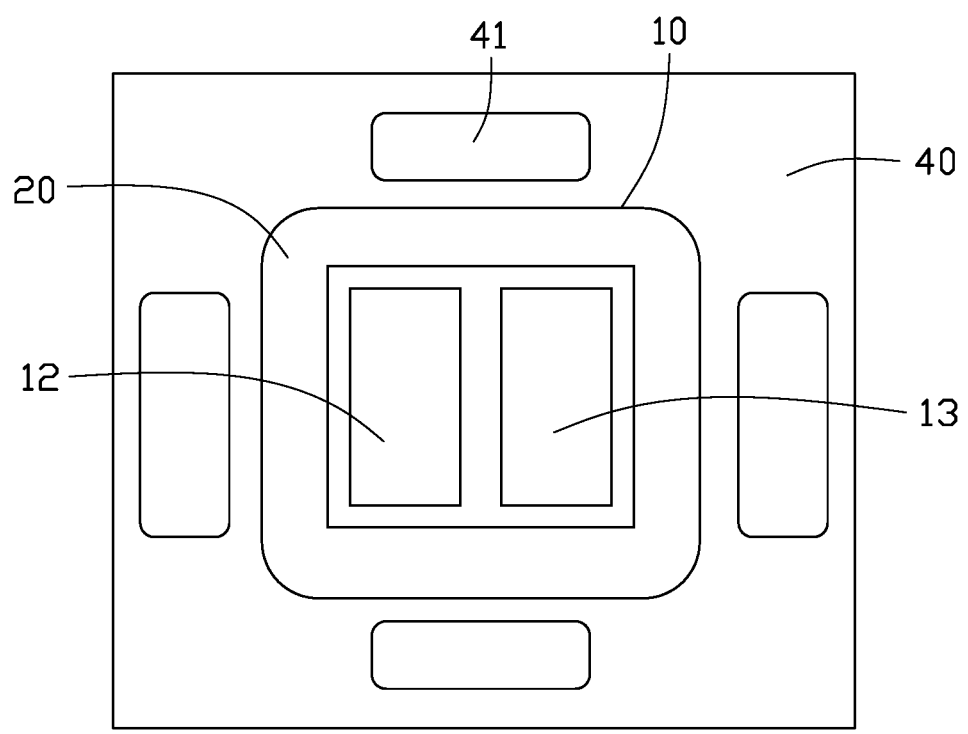
FIG. 4 is an upward view of another embodiment of the light emitting diode package.

FIG. 4 illustrates another embodiment of a light emitting diode package 100a. The supporting layer 40 of the light emitting diode package 100a defines a plurality of through holes 41 to improve a strength of connection and a marginal adaptation between the supporting layer 40 and the reflecting layer 30. Each through hole 41 extends from the third top surface 402 to the fourth bottom surface 401 to pass through the supporting layer 40. In at least one embodiment, each through hole 41 can be cuboid. The through holes 41 are evenly spaced in the supporting layer 40. In another embodiment, number, shape and distribution of the through holes 41 can be varied.

Figure 5:
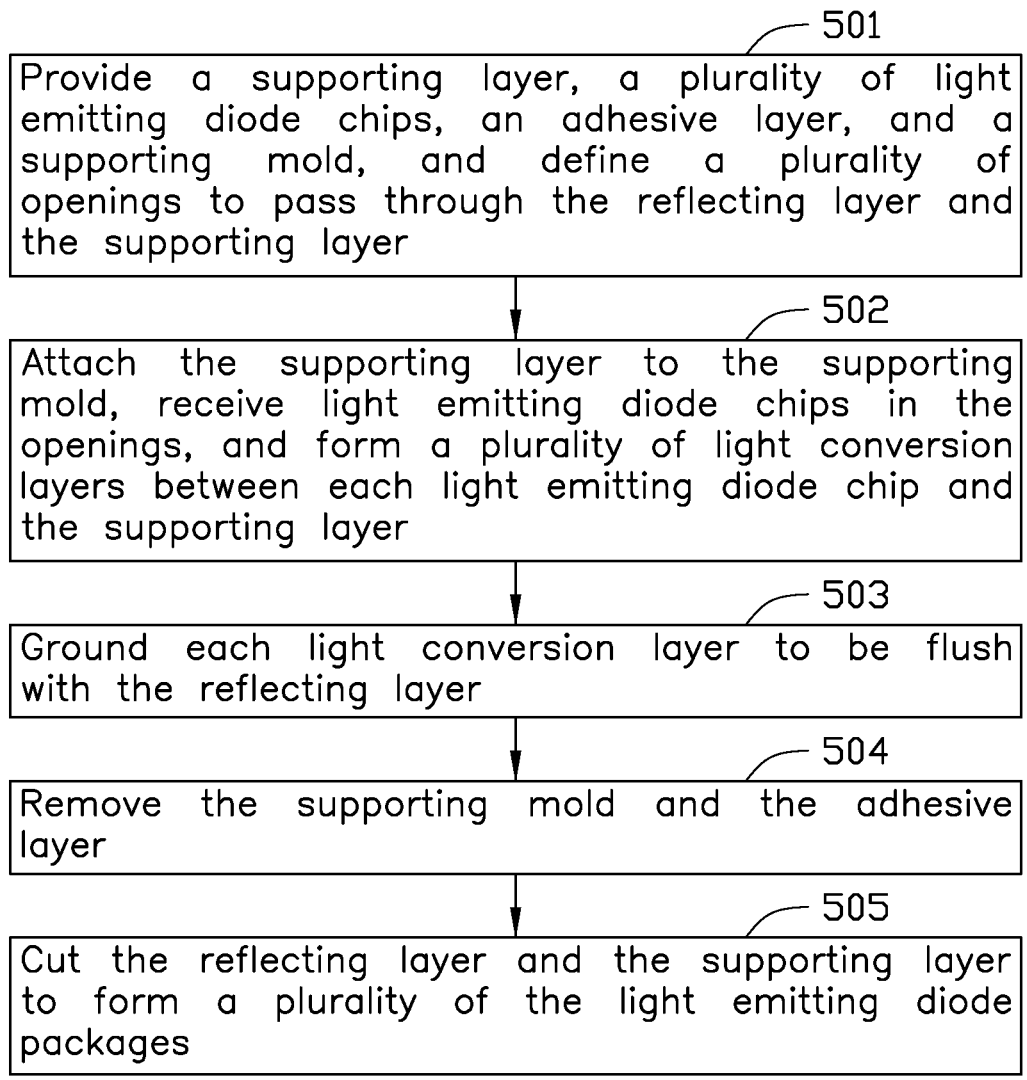
FIG. 5 is a flowchart of an embodiment of a method for manufacturing the light emitting diode package of FIG. 1.

FIG. 5 illustrates a flowchart of a method in accordance with an exemplary embodiment. The exemplary method for manufacturing a light emitting diode package 100 (shown in FIG. 1) is provided by way of example only, as there are a variety of ways to carry out the method. Each block shown in FIG. 5 represents one or more processes, methods, or subroutines carried out in the exemplary method. Furthermore, the illustrated order of blocks is by example only and the order of the blocks can be changed. Additional blocks may be added or fewer blocks may be utilized, without departing from this disclosure. The exemplary method can begin at block 501.

Figure 6:
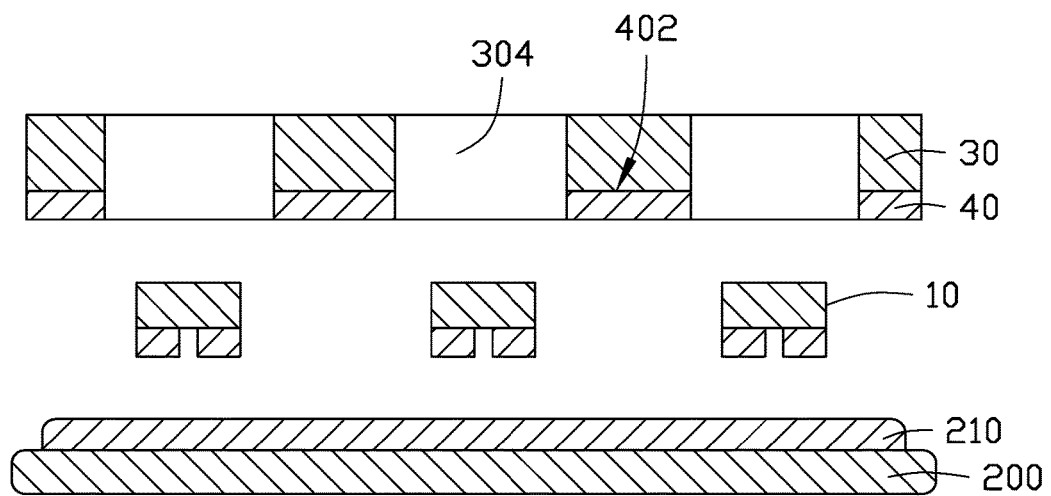
FIG. 6 is a cross-sectional view of a supporting layer, a plurality of light emitting diode chips, an adhesive layer, and a supporting mold, and showing a plurality of openings defined to pass through the reflecting layer and the supporting layer.

At block 501, referring to FIG. 6, a supporting layer 40, a plurality of light emitting diode chips 10, and a supporting mold 200 are provided, and a reflecting layer 30 is formed on a third top surface 402 of the supporting layer 40. A plurality of openings 304 is defined to pass through the reflecting layer 30 and the supporting layer 40. An adhesive layer 210 is formed on a surface of the supporting mold 200.

Figure 7:
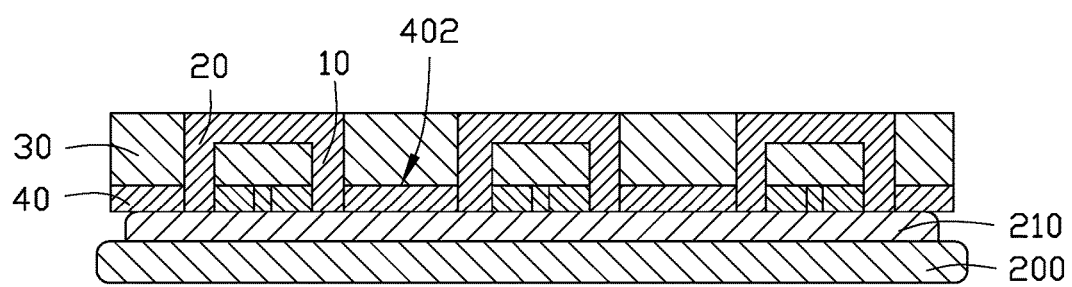
FIG. 7 is a cross-sectional view showing the supporting layer attached to the supporting mold, the light emitting diode chips received in the openings, and a plurality of light conversion layers formed between each light emitting diode chip and the supporting layer of FIG. 6.

At block 502, referring to FIG. 7, a fourth bottom surface 401 of the supporting layer 40 facing away from the third top surface 402 is attached to the supporting mold 200 by the adhesive layer 210. Each light emitting diode chip 10 is received in one of the plurality of openings 304. A plurality of light conversion layers 20 is formed by filling and curing the light conversion material between each light emitting diode chip 10 and the supporting layer 40.

Figure 8:
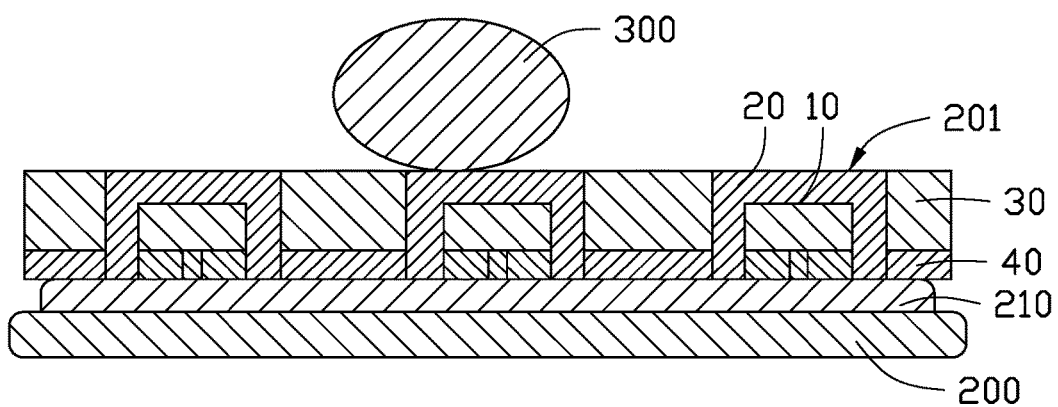
FIG. 8 is a cross-sectional view showing each light conversion layer ground to be flush with the reflecting layer of FIG. 7.

At block 503, referring to FIG. 8, a first top surface 201 of each light conversion layer 20 facing away from the supporting mold 200 is ground or abraded by an abrasive tool 300 so as to be flush with the reflecting layer 30.

Figure 9:
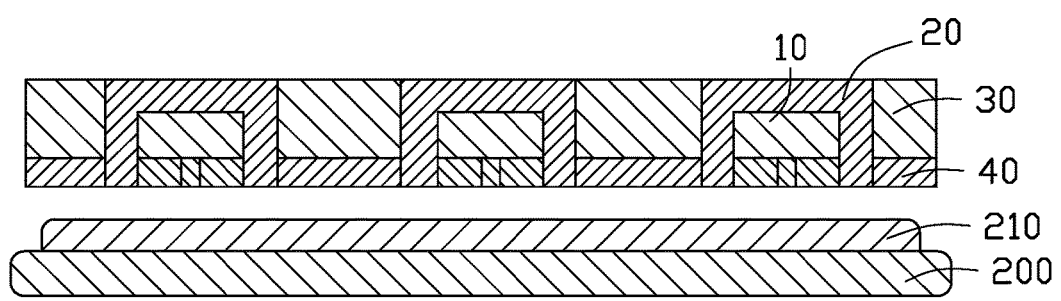
FIG. 9 is a cross-sectional view showing the supporting mold and the adhesive layer of FIG. 8 removed.

At block 504, referring to FIG. 9, the supporting mold 200 and the adhesive layer 210 are removed.

Figure 10:
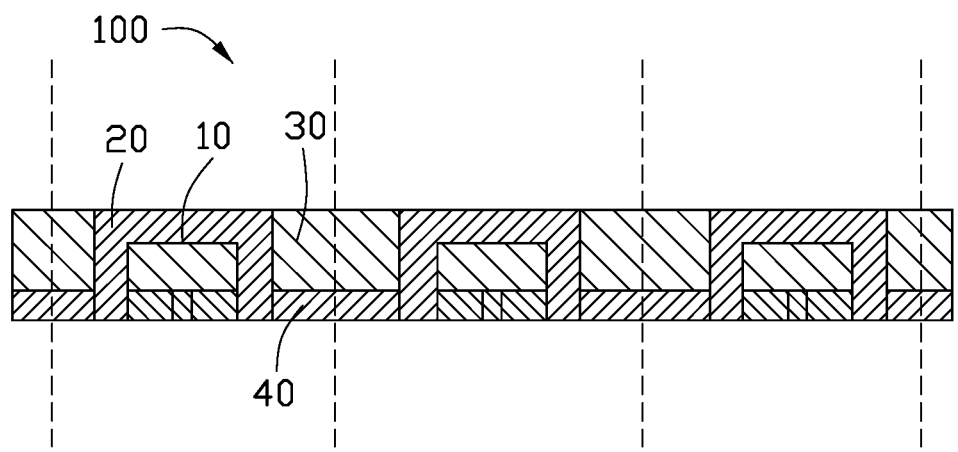
FIG. 10 is a cross-sectional view showing a plurality of light emitting diode package of FIG. 1 formed by cutting the reflecting layer and the supporting layer of FIG. 9.

At block 505, referring to FIG. 10, the reflecting layer 30 and the supporting layer 40 are cut along a direction between every two adjacent openings 304, thereby forming a plurality of light emitting diode packages 100.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A light emitting diode package comprising:
   a light emitting diode chip comprising:
      a light output top surface;
      a first side wall;
      a first electrode; and
      a second electrode;
      wherein the first electrode and the second electrode face away from the light output top surface, the first electrode and the second electrode have a first bottom surface facing away from the light output top surface, the first side wall connects the light output top surface and the first bottom surface;
   a light conversion layer comprising:
      a first top surface;
      a second bottom surface facing away from the first top surface; and
      a second side wall connecting the first top surface and the second bottom surface;
   a reflecting layer surrounding and attached to the second side wall of the light conversion layer;
   a supporting layer made of metal material;
   wherein the light conversion layer covers the light output top surface and the first side wall, the reflecting layer comprises a second top surface and a third bottom surface facing away from the second top surface, the third bottom surface is adjacent to the second bottom surface, the supporting layer is formed on the third bottom surface, surrounds and is attached to the second side wall; the supporting layer comprises a third top surface attached to the third bottom surface and a fourth bottom surface facing away from the third top surface, the fourth bottom surface, the second bottom surface, and the first bottom surface are flush with each other.

2. The light emitting diode package of claim 1, wherein the supporting layer is made of a metal material selected at least one of copper, nickel, and silver.

3. The light emitting diode package of claim 1, wherein the supporting layer has a thickness of 50 μm to 150 μm.

4. The light emitting diode package of claim 1, wherein a plurality of through holes is defined in the supporting layer, and each the plurality of through holes extends from the third top surface to the fourth bottom surface to pass through the supporting layer.

5. The light emitting diode package of claim 1, wherein the light conversion layer comprises a main portion attached to the light output top surface, an extending portion attached to the first side wall, and a filling portion formed between the first electrode and the second electrode.

6. The light emitting diode package of claim 1, wherein the light conversion layer is made of a light transmitting material comprising fluorescent powders or quantum dots.

7. The light emitting diode package of claim 1, wherein the second top surface is flush with the first top surface.

8. The light emitting diode package of claim 1, wherein the reflecting layer is made of an opaque resin material comprising titanium dioxide or silicon dioxide.

9. The light emitting diode package of claim 1, wherein the reflecting layer has a thickness of about 150 μm to about 300 μm.

10. The light emitting diode package of claim 1, wherein the light emitting diode chip is made of a semiconducting material selected from gallium nitride or gallium arsenide.

\* \* \* \* \*